(12) United States Patent
Yoon

(10) Patent No.: US 8,232,157 B2
(45) Date of Patent: Jul. 31, 2012

(54) SEMICONDUCTOR DEVICE AND METHOD OF MANUFACTURING THE SAME

(75) Inventor: Yeo-Cho Yoon, Seongnam-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 318 days.

(21) Appl. No.: 12/649,261

(22) Filed: Dec. 29, 2009

(65) Prior Publication Data

US 2010/0164012 A1 Jul. 1, 2010

(30) Foreign Application Priority Data

Dec. 31, 2008 (KR) .................. 10-2008-0137848

(51) Int. Cl.
*H01L 21/8238* (2006.01)
(52) U.S. Cl. ......... 438/207; 438/202; 257/370; 257/378
(58) Field of Classification Search .................. None
See application file for complete search history.

(56) References Cited

U.S. PATENT DOCUMENTS

| | | | | |
|---|---|---|---|---|
| 6,914,308 B2 * | 7/2005 | Fujii | ............................. | 257/378 |
| 7,972,917 B2 * | 7/2011 | Furuhata et al. | .............. | 438/199 |
| 2003/0102512 A1 * | 6/2003 | Chatterjee | ..................... | 257/370 |

* cited by examiner

*Primary Examiner* — Benjamin Sandvik
(74) *Attorney, Agent, or Firm* — Sherr & Vaughn, PLLC

(57) ABSTRACT

A semiconductor device includes a semiconductor substrate including a CMOS region and a bipolar region, a first N well and a first P well in the CMOS region, a PMOS device in the first N well and an NMOS device in the first P well, a deep P well in the bipolar region, a second N well in the deep P, a second isolation layer between the deep P well and the second N well, a third isolation in the second N well, a collector in the second N well between the second and third isolation layers, and a base formed in the second N well and having a bottom surface including first type impurities to contact the emitter.

8 Claims, 4 Drawing Sheets

SEMICONDUCTOR DEVICE AND METHOD OF MANUFACTURING THE SAME

Figure 1:
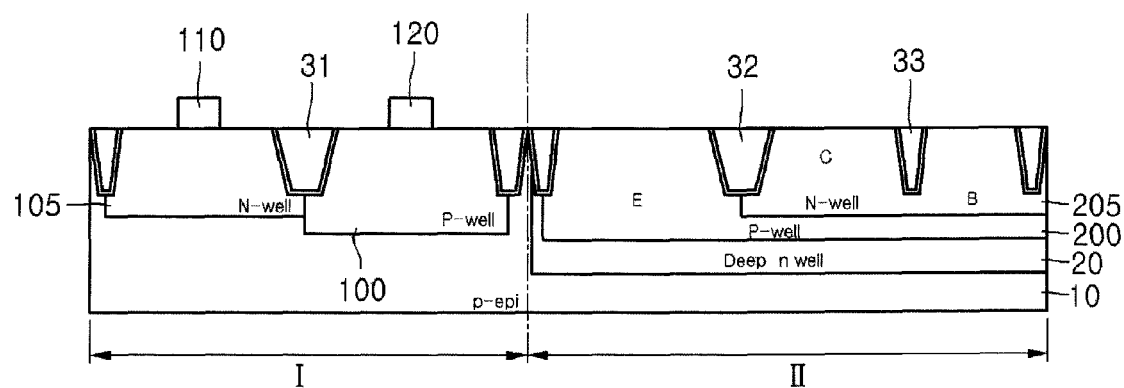

The present application claims priority under 35 U.S.C. §119 to Korean Patent Application No. 10-2008-0137848 (filed on Dec. 31, 2008), which is hereby incorporated by reference in its entirety.

BACKGROUND

Generally, when compared to a Metal-Oxide Semiconductor Field Effect Transistor (MOSFET), a Bipolar Junction Transistor (BJT) has superior current performance and faster operating speed. Accordingly, the recent use of the BJT in a specific part of an individual product has been more increased than the use of the MOSFET.

An analog CMOS semiconductor device has a superior frequency response characteristic. In contrast, the CMOS semiconductor device is inferior to a compound semiconductor or a bipolar device in terms of a power gain and a noise characteristic under a low frequency. In particular, as the level of integration of a device has increased, noise may increase in proportion to a trap density of a gate oxide layer that is an important factor of a noise characteristic, so the noise characteristic cannot be enhanced. Accordingly, the development of a semiconductor device having enhanced frequency and noise characteristics is required.

SUMMARY

Embodiments are related to a semiconductor device and a method of manufacturing the same in which noise characteristics can be enhanced by reducing the resistance of a base by a bipolar transistor having a P type bottom emitter structure in a CMOS transistor process.

Embodiments are related to a semiconductor device and a method of manufacturing the same that realizes a high-integrated device by forming a CMOS transistor and a bipolar transistor on a single substrate.

In accordance with embodiments, a semiconductor device can include at least one of the following: a semiconductor substrate including a CMOS region and a bipolar region, a first N well and a first P well separated from each other by a first isolation layer formed in the CMOS region, a PMOS device formed in the first N well and an NMOS device formed in the first P well, a deep P well formed in the bipolar region, a second N well formed in the deep P well to expose a portion of the deep P well, a second isolation layer formed between the deep P well and the second N well to define an emitter region, an emitter including second type impurities in the deep P well, a third isolation layer defining base and collector regions in the second N well, a collector including the second type impurities in the second N well between the second and third isolation layers, and a base formed in the second N well at one side of the third isolation layer and having a bottom surface including first type impurities which contacts the emitter.

In accordance with embodiments, a method of manufacturing a semiconductor device can include at least one of the following: forming a semiconductor substrate including a CMOS region and a bipolar region, forming a first isolation layer in the CMOS region, and forming second and third isolation layers in the bipolar region, forming a first P well at one side of the first isolation layer, and forming a first N well at an opposite side of the first isolation layer, forming a deep P well in the bipolar region, and forming a second N well in the deep P well corresponding to one side of the second isolation layer, forming a first gate in the first N well, and forming a second gate in the first P well, forming a first source/drain by implanting second type impurities into the first N well, and forming an emitter and a collector by implanting second type impurities into the deep P well and the second N well at both sides of the second isolation layer, and forming a second source/drain by implanting the second type impurities into the first P well, and forming a base by implanting the second type impurities into the second N well at one side of the third isolation layer.

In accordance with embodiments, a semiconductor device can include at least one of the following: a semiconductor substrate including a CMOS region and a bipolar region; a first isolation layer formed in the semiconductor substrate; a first N well formed in the CMOS region; a first P well formed in the CMOS region and separated from the first N well by the first isolation layer; a PMOS device formed in the first N well; an NMOS device formed in the first P well; a deep P well formed in the bipolar region; a second N well formed in the deep P well; a second isolation layer formed between the deep P well and the second N well to define an emitter region; an emitter formed in the deep P well; a third isolation layer formed in the second N well defining a base region and a collector region; a collector formed in the second N well between the second and third isolation layers; and a base formed in the second N well at one side of the third isolation layer, the base contacting the emitter.

DRAWINGS

Example FIGS. 1 to 8 illustrate a method of manufacturing process a semiconductor device, in accordance with embodiments.

DESCRIPTION

Figure 8:
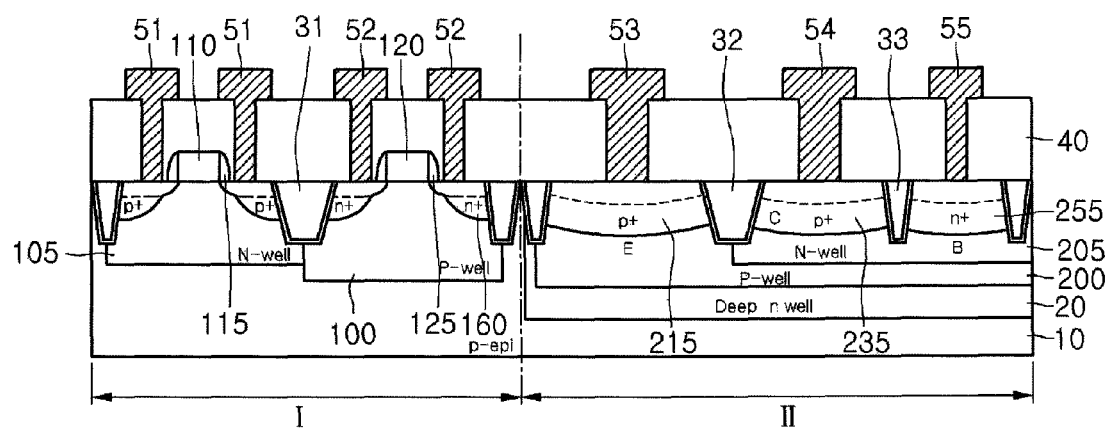

As illustrated in example FIG. 8, a semiconductor device in accordance with embodiments includes semiconductor substrate 10 having a CMOS region I and a bipolar region II. First N well 105 and first P well 100 are formed in semiconductor substrate 10 and separated from each other by first isolation layer 31 formed in the CMOS region I. A PMOS device is formed in first N well 105 and an NMOS device formed in P well 100. Deep P well 200 is formed in bipolar region II and second N well 205 is formed in deep P well 200 to expose a portion of deep P well 200. Second isolation layer 32 is formed between deep P well 200 and second N well 205 to define an emitter region. Emitter E including second type impurities is formed in deep P well 200. Third isolation layer 33 defining a base region and a collector region is formed in second N well 205. Collector C including second type impurities is formed in second N well 205 and corresponds to a space between second isolation layer 32 and third isolation layer 33. Base B having first type impurities is formed in second N well 205 and positioned at one side of third isolation layer 33 to contact emitter E. Emitter E includes P type impurities, base B includes N type impurities, and collector C includes P type impurities, thereby forming a PNP bipolar transistor.

Collector C is formed in second N well 205 between second isolation layer 32 and third isolation layer 33. Base B is formed in second N well 205 in such a manner that base B contacts collector C. Emitter E is formed in deep P well 200 in such a manner that emitter E contacts base B. Accordingly, emitter E can have the structure of a P type bottom emitter. Deep N well 20 may be formed below deep P well 200 to separate emitter E from semiconductor substrate 100.

In accordance with embodiments, a bipolar transistor having a P type bottom emitter structure is adapted to a CMOS device, so that a current gain and a breakdown characteristic can be enhanced. Accordingly, frequency and noise characteristics can be improved. In addition, the CMOS transistor and the P type bipolar transistor are realized on and/or over a single substrate such that a device has high-speed driving capability and a low power consumption characteristic.

Hereinafter, a method of manufacturing the semiconductor device in accordance with embodiments will be described with reference to example FIGS. 1 to 8. Embodiments relate to a vertical type PNP bipolar device realized in a CMOS process.

As illustrated in example FIG. 1, first region I including a CMOS transistor (TR) and second region II including a PNP bipolar TR are defined in semiconductor substrate 10. Semiconductor substrate 10 can be a single crystalline or a polycrystalline silicon substrate. Semiconductor substrate 10 may be a substrate doped with P type impurities or N type impurities. For example, if semiconductor substrate 10 is a P type (P++) substrate, a low-concentration P type epitaxial (p-epi) layer may be formed on and/or over semiconductor substrate 10 through an epitaxial process.

Deep N well 20 is formed at a deep region of second region II. Deep N well 20 may be formed through an annealing process after heavily and selectively implanting N type impurities only into second region II of semiconductor substrate 10. First isolation layer 31, second isolation layer 32 and third isolation layer 33 are formed in first region I and second region II to define an active region. First isolation layer 31, second isolation layer 32 and third isolation layer 33 may be formed by gap-filling an oxide layer in a trench after the trench has been formed through an STI process. In addition, a barrier layer including P type impurities may be formed around the first isolation layer 31, second isolation layer 32 and third isolation layer 33. First isolation layer 31 of first region I may define the PMOS region and the NMOS region of the CMOS transistor (TR). Second isolation layer 32 and third isolation layer 33 of second region II may define the emitter, collector and base regions of the bipolar TR.

First P well 100 may be formed at one side of first isolation layer 31 in first region I. First N well 105 may be formed at the other side of the first isolation layer 31. The PMOS region and the NMOS region can be formed by first N well 105 and first P well 100. Deep P well 200 is formed inside deep N well 20 in second region II. Second N well 205 is formed at one side of second isolation layer 32 to expose a portion of deep P well 200. Deep P well 20 may have a junction profile lower than that of deep N well 10. Deep P well 200 is formed simultaneously when first P well 100 is formed. Accordingly, deep P well 200 and first P well 100 have the same depth. The emitter region may be formed in deep P well 200 exposed by second N well 205 and second isolation layer 32.

Second N well 205 is formed in deep P well 200 to form collector C and base B. Second N well 205 is formed at both sides of third isolation layer 33 in deep P well 200, and the collector and base regions can be formed by third isolation layer 33. Since second N well 205 is formed simultaneously with first N well 105, second N well 205 and first N well 105 may have the same depth. As described above, second N well 205 is selectively formed in deep P well 200 to determine the emitter, collector, and base regions. Deep P well 200 and second N well 205 are separated from each other by second isolation layer 32, and second N well 205 is divided by third isolation layer 33. Accordingly, the emitter region is formed in deep P well 200, and the collector and base regions are formed in second N well 205.

First gate 110 is then formed on and/or over first N well 105, and second gate 120 is formed on and/or over first P well 100. First gate 110 and second gate 120 may be selectively formed on and/or over first N well 105 and first P well 100, respectively, by selectively patterning a gate oxide layer and a gate conductive layer after depositing the gate oxide layer and the gate conductive layer on and/or over semiconductor substrate 10.

Figure 2:
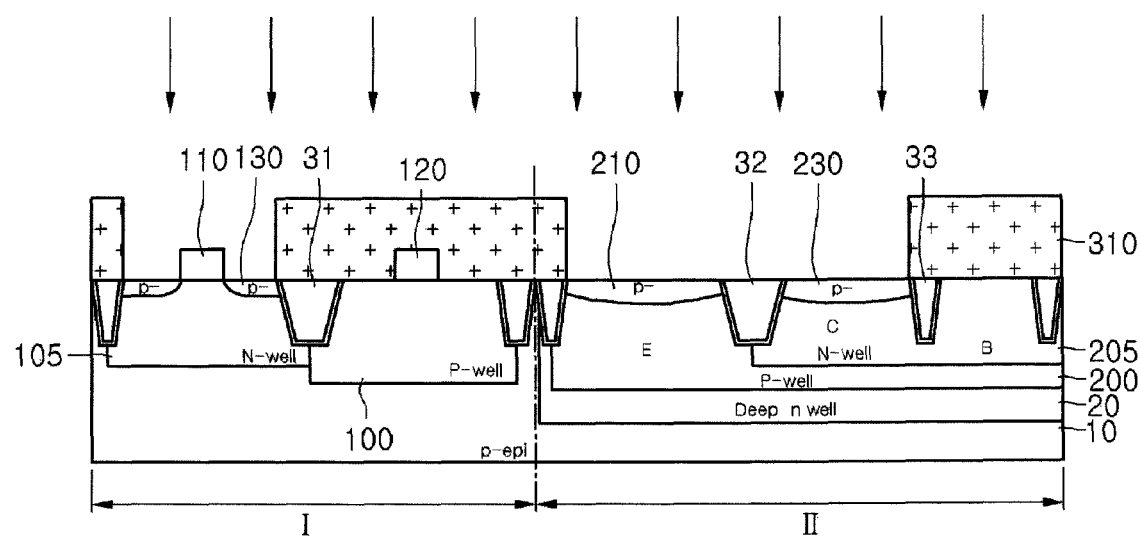

As illustrated in example FIG. 2, first photoresist pattern 310 is formed on and/or over semiconductor substrate 10. First photoresist pattern 310 exposes first N well 105. First photoresist pattern 310 may selectively expose the emitter region of deep P well 200 and the collector region of second N well 205. First LDD regions 130 are then formed at shallow regions of first N well 105 such that first LDD regions 130 are aligned at both sides of first gate 110. In addition, second type shallow doped layers 210, 230 are formed at shallow regions of the emitter and collector regions of deep P well 200. First LDD regions 130 and second type shallow doped regions 210, 230 may include low-concentration P type (p−) impurities.

First LDD regions 130 and second type shallow doped regions 210, 230 may be formed by implanting P type impurities into first N well 105, the emitter region, and the collector region using first photoresist pattern 310 as an ion implantation mask. For example, the P type impurities may include boron ions (11B+) belonging to III group of a periodic table. Thereafter, first photoresist pattern 310 is removed.

Figure 3:
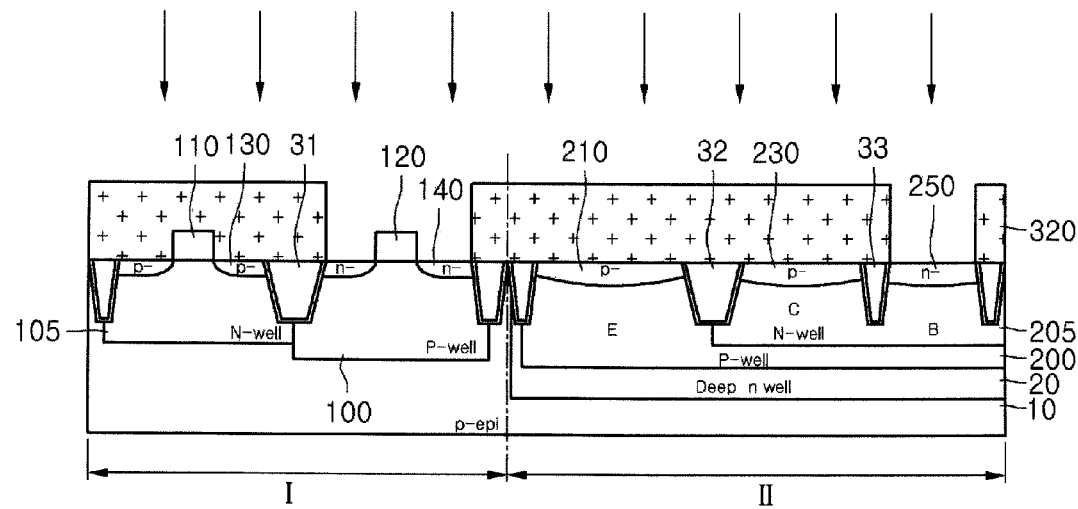

As illustrated in example FIG. 3, second photoresist pattern 320 is formed on and/or over semiconductor substrate 10. Second photoresist pattern 320 exposes first P well 100. Second photoresist pattern 320 may selectively expose only the base region of second N well 205. Second LDD regions 140 are then formed at shallow regions of first P well 100 such that second LDD regions 140 are aligned at both sides of second gate 120. First shallow doped layer 250 is then formed at a shallow region of the base region of second N well 205. Second LDD regions 140 and first type shallow doped layer 250 may be formed by implanting N type impurities into first P well 100 and the base region using second photoresist pattern 320 as an ion implantation mask. For example, the N impurities may include phosphorus ions (31P+) belonging to V group of the periodic table. Second photoresist pattern 320 is then removed.

Figure 4:
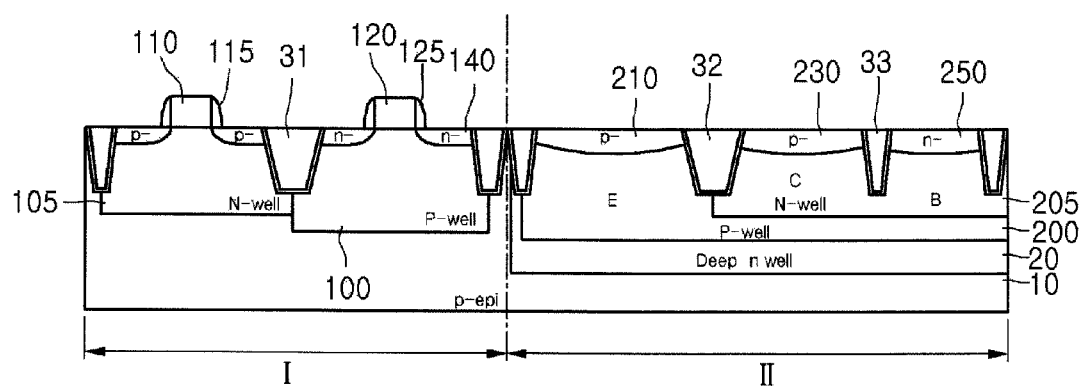

As illustrated in example FIG. 4, spacers 115, 125 are then formed at sidewalls of first gate 110 and second gate 120. Spacers 115, 125 may be formed by etching an entire surface of an insulating layer after forming the insulating layer on and/or over semiconductor substrate 10.

Figure 5:
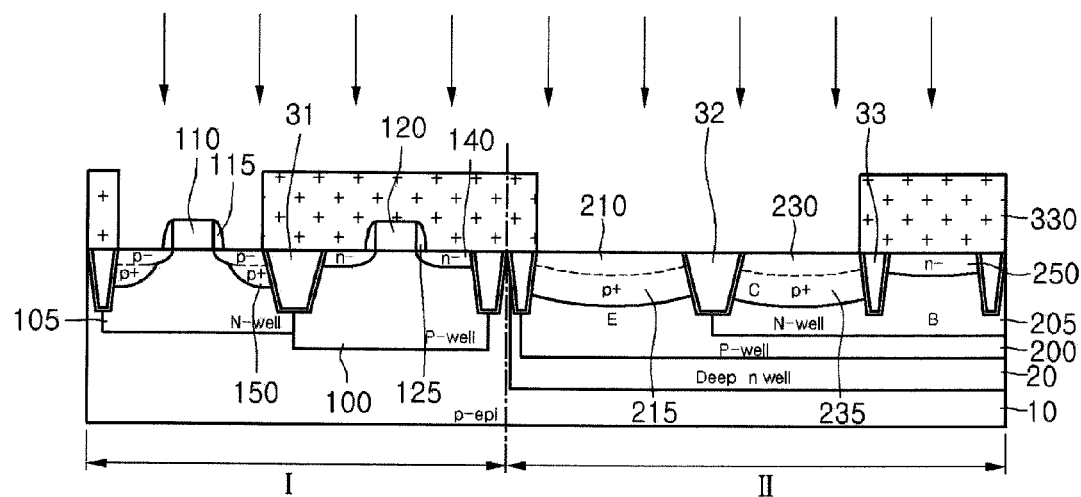

As illustrated in example FIG. 5, third photoresist pattern 330 is formed on and/or over semiconductor substrate 10. Third photoresist pattern 330 may selectively expose first N well 105, the emitter region of deep P well 200, and the collector region of second N well 205. In other words, third photoresist pattern 330 may be formed by using the same mask as that of first photoresist pattern 310.

First source/drain 150 is formed at a deep region of first N well 105 such that first source/drain 150 is aligned with spacer 115 of first gate 110. Second deep doped layers 215, 235 are formed to contact second type shallow doped layers 210, 230 of the emitter and collector regions of deep P well 200. First source/drain 150 and second type deep doped layers 215, 235 may include high concentration P type impurities. For example, the P type impurities may include boron ions (49BF+) belonging to the III group. Accordingly, emitter E is formed by second type shallow doped layer 210 and second type deep doped layer 215 of the emitter region.

In addition, collector C is formed by second shallow doped layer 230 and second type deep doped layer 235 in the collector region. Since emitter E includes P type impurities the same as those of deep P well 200, the entire portion of deep P well 200 may be used as emitter E. In other words, emitter E having a P type bottom structure may be formed by the structure of deep P well 200. Collector C includes P type impurities, and is selectively formed in second N well 205 corresponding to the space between the second isolation layer 32 and third isolation layer 33. Accordingly, collector C is separated from emitter E. Thereafter, third photoresist pattern 330 may be removed.

Figure 6:
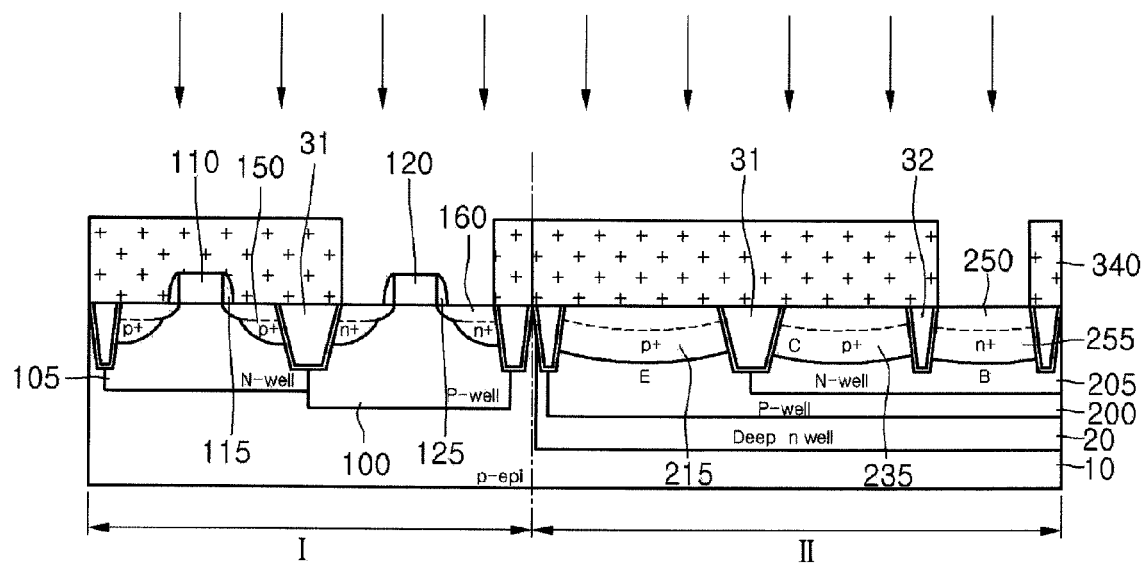

As illustrated in example FIG. 6, fourth photoresist pattern 340 is formed on and/or over semiconductor substrate 10. Fourth photoresist pattern 340 exposes first P well 100, and may selectively expose only the base region of second N well 255. In other words, fourth photoresist pattern 340 may be formed a mask the same as that of second photoresist pattern 320. Second source/drain 140 is formed at a deep region of the first P well 100 such that the second source/drain 140 is aligned with spacer 125 of second gate 120. First deep doped layer 255 is formed to contact first type shallow doped layer 250 of second N well 205. Second source/drain 140 and second type deep doped layer 255 may be formed by implanting N type impurities into first P well 100 and the base region by using fourth photoresist pattern 340 as an ion implantation mask. For example, N type impurities may include arsenic ions (75As+) belonging to the Group V.

Base B is formed in the base region by first type shallow doped layer 250 and first type deep doped layer 255. Base B may include N type impurities the same as those of second N well 205. Accordingly, base B is interposed between collector C and emitter E to separate collector C from emitter E. Meaning, emitter E, collector C, and base B may form a PNP bipolar structure. Emitter E is formed in deep P well 200 so that the bipolar transistor may have a P type bottom emitter structure. Accordingly, a current gain and a breakdown voltage characteristic can be improved, so that low-frequency noise can be overcome in a MOS structure. Fourth photoresist pattern 340 is then removed.

The CMOS TR and the bipolar TR are formed on and/or over one substrate as described above, so that device integration can be achieved. In addition, when first LDD region 130 and second LDD region 140 and first source/drains 150 and second source/drains 160 of the CMOS TR, emitter E, collector C, and base B of the bipolar TR are simultaneously formed. Accordingly, since an additional mask process is omitted, so that productivity can be improved.

Figure 7:
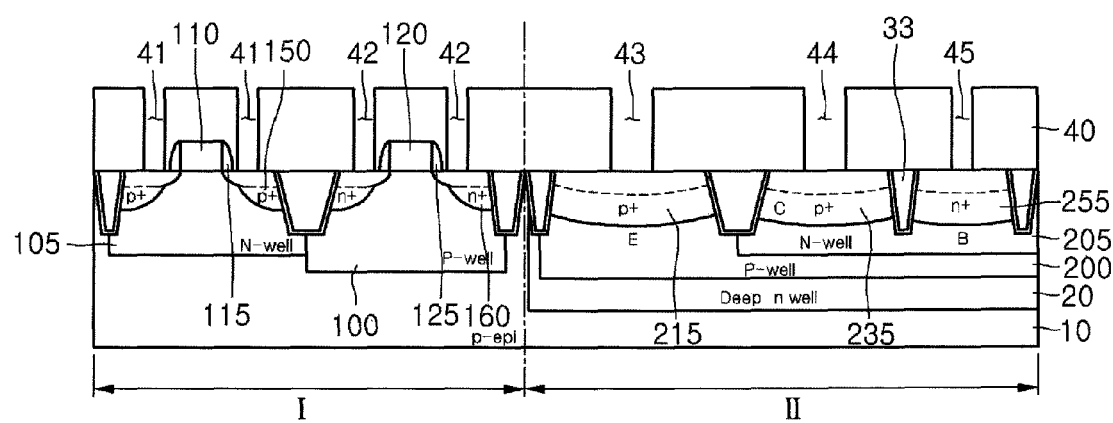

As illustrated in example FIG. 7, interlayer dielectric layer 40 is formed on and/or over semiconductor substrate 10 including the CMOS TR and the bipolar TR. For example, interlayer dielectric layer 40 may include an oxide layer or a nitride layer. First contact hole 41, second contact hole 42, third contact hole 43, fourth contact hole 44 and fifth contact hole 45 are formed while passing through interlayer dielectric layer 40. First contact hole 41 may expose first source/drain 150. Second contact hole 42 may expose second source/drain 160. Third contact hole 42 may expose the surface of emitter E. Fourth contact hole 44 may expose the surface of collector C, and fifth contact hole 45 may expose the surface of base B.

As illustrated in example FIG. 8, a metal layer including tungsten (W) is gap-filled in first contact hole 41, second contact hole 42, third contact hole 43, fourth contact hole 44 and fifth contact hole 45, thereby forming first contact plug 51 and second contact plug 52, emitter electrode 53, collector electrode 54 and base electrode 55.

In accordance with embodiment, a PNP bipolar TR is formed on and/or over the semiconductor substrate having a CMOS TR, so that device integration can be integrated. Accordingly, the frequency and noise characteristic can be improved in the CMOS TR. When an NMOS device of the CMOS TR is formed, the emitter and the collector of the bipolar TR can be formed simultaneously. In addition, when the PMOS device of the CMOS TR is formed, the base of the bipolar TR can be formed simultaneously. Accordingly, since an additional ion implantation mask used to form the bipolar TR is omitted, the manufacturing process can be simplified, and the productivity can be enhanced. Since a bipolar TR having a superior flicker noise characteristic is used, a superior phase noise characteristic can be obtained, the semiconductor device according to the embodiment is applicable to a device such as a voltage controlled oscillator VCO circuit.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a semiconductor substrate including a CMOS region and a bipolar region;
    forming a first isolation layer in the CMOS region and second and third isolation layers in the bipolar region;
    forming a first P well at one side of the first isolation layer and a first N well at an opposite side of the first isolation layer;
    forming a deep P well in the bipolar region and a second N well in the deep P well corresponding to one side of the second isolation layer;
    forming a first gate in the first N well and a second gate in the first P well;
    forming a first source/drain by implanting second type impurities into the first N well, and an emitter and a collector by implanting second type impurities into the deep P well and the second N well at both sides of the second isolation layer; and then
    forming a second source/drain by implanting the second type impurities into the first P well, and a base by implanting the second type impurities into the second N well at one side of the third isolation layer.

2. The method of claim 1, further comprising forming a deep N well at a deep region of the bipolar region before forming the deep P well.

3. The method of claim 1, wherein the emitter and the collector include P type impurities and the base includes N type impurities so that a PNP bipolar transistor is formed.

4. The method of claim 1, further comprising:
    forming a first photoresist pattern over the semiconductor substrate to selectively expose the first N well and portions of the deep P well and the second N well at both sides of the second isolation layer; and then
    forming first LDD regions in the first N well corresponding to both sides of the first gate, and second type shallow doped layers at a portion of the second N well and the deep P well using the first photoresist pattern as an ion implantation mask, after forming the first and second gates.

5. The method of claim 4, wherein forming the first source/drain in the first N well and the forming of the emitter and the collector in emitter and collector regions comprises:
   forming a third photoresist pattern using a mask identical to a mask of the first photoresist pattern; and then
   forming the first source/drain below the first LDD region and a second type deep doped layer below the second type shallow doped layer using the third photoresist pattern as an ion implantation mask.

6. The method of claim 1, further comprising:
   forming a second photoresist pattern to expose the first P well of the semiconductor substrate and the second N well at one side of the third isolation layer; and
   forming second LDD regions at the first P well corresponding to both sides of the second gate, and a first type shallow doped layer at a portion of the second N well by using the second photoresist pattern as an ion implantation mask, after forming the first and second gates.

7. The method of claim 6, wherein forming of the second source/drain in the first P well, and the base in the base region comprises:
   forming a fourth photoresist pattern using a mask identical to a mask of the second photoresist pattern; and then
   forming the second source/drain below the second LDD region and a first type deep doped layer below the first type shallow doped layer using the fourth photoresist pattern as an ion implantation mask.

8. The method of claim 5, further comprising:
   forming an interlayer dielectric layer; and then
   forming an emitter electrode, a collector electrode and a base electrode connected with the emitter, the collector, and the base, respectively, through the interlayer dielectric layer, after forming the base in the base region.

* * * * *